United States Patent
Paak

(10) Patent No.: US 7,301,811 B1
(45) Date of Patent: *Nov. 27, 2007

(54) COST EFFICIENT NONVOLATILE SRAM CELL

(75) Inventor: Sunhom Paak, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 56 days.

This patent is subject to a terminal disclaimer.

(21) Appl. No.: 10/990,173

(22) Filed: Nov. 15, 2004

(51) Int. Cl.
*G11C 11/34* (2006.01)
*G11C 16/04* (2006.01)

(52) U.S. Cl. ................... 365/185.1; 365/185.05

(58) Field of Classification Search ............... 257/315; 365/185.1, 185.08, 185.05, 189.05, 154
See application file for complete search history.

(56) References Cited

U.S. PATENT DOCUMENTS

| | | | |
|---|---|---|---|
| 4,924,119 A * | 5/1990 | Lee | 326/50 |
| 5,047,814 A * | 9/1991 | Hazani | 257/317 |
| 5,272,368 A | 12/1993 | Turner et al. | |
| 5,594,687 A | 1/1997 | Lin et al. | |
| 5,616,942 A | 4/1997 | Song | |
| 5,627,392 A * | 5/1997 | Diorio et al. | 257/315 |
| 5,847,993 A | 12/1998 | Dejenfelt | |
| 5,986,932 A * | 11/1999 | Ratnakumar et al. | 365/185.08 |
| 6,141,248 A * | 10/2000 | Forbes et al. | 365/185.08 |
| 6,215,689 B1 * | 4/2001 | Chhor et al. | 365/63 |
| 6,963,103 B2 | 11/2005 | Forbes | |
| 7,049,872 B2 | 5/2006 | Diorio et al. | |

* cited by examiner

*Primary Examiner*—Richard T. Elms
*Assistant Examiner*—Allison P. Bernstein
(74) *Attorney, Agent, or Firm*—LeRoy Maunu; Justin Liu

(57) ABSTRACT

A cost efficient nonvolatile memory cell may include an inverter, an access gate coupled to the inverter for controlling access to the memory cell, and a control gate. The inverter may include a floating gate at an input of the inverter, the floating gate formed in a first polysilicon layer, and a tunnel window formed in a tunnel oxide area, wherein the tunnel oxide area is covered by at least a portion of the floating gate. The control gate may control charge on the floating gate, and may be formed in a second polysilicon layer, wherein the second polysilicon layer is above the first polysilicon layer.

16 Claims, 9 Drawing Sheets

COST EFFICIENT NONVOLATILE SRAM CELL

FIELD OF THE INVENTION

The invention relates to integrated circuits, and more particularly, to nonvolatile memory cells.

BACKGROUND OF THE INVENTION

A programmable logic device (PLD) is a well-known type of digital integrated circuit that can be programmed to perform specified logic functions. Examples of PLDs include the field programmable gate array (FPGA), and the complex programmable logic device (CPLD). PLDs typically include various programmable resources such as configurable logic blocks (CLBs), function blocks, programmable input/output blocks (IOBs), and a programmable interconnect structure. Some PLDs also include additional programmable resources (e.g., DLLs, RAM, multipliers, processors, transceivers).

The programmable resources of a PLD are typically programmed by loading a stream of configuration data (bitstream) into internal configuration memory cells. The collective states of the individual memory cells then determine the function of the PLD. The data bits can be stored in volatile memory, such as static RAM (SRAM) cells, in non-volatile memory, such as flash memory or electrically erasable programmable read-only memory (EEPROM), or in any other type of memory cell. The memory cells can be part of an external device, such as an external PROM, or can be located on-chip. It can be advantageous to store such configuration information in nonvolatile memory because the configuration information persists even after electrical power is disconnected from a particular device.

In some situations, however, EEPROM cells can be slower and can consume more power than SRAM cells. For example, some EEPROM cells require a sense amplifier, which can consume a significant amount of power, to detect or retrieve stored data. SRAM, on the other hand, can typically provide the stored data without such sense amplifiers. Furthermore, SRAM cells, although volatile, can be faster than EEPROM cells. Thus, in contrast to EEPROMs, SRAM cells can consume relatively little power with improved performance while enabled and operating.

To address this power and performance problem, and other problems, some PLDs, including some CPLDs, use both volatile and nonvolatile memory. Such PLDs include the CoolRunner II family of CPLDs available from Xilinx, Inc. of San Jose, Calif. In these PLDs, configuration data is stored on-chip (or sometimes on an external chip) in non-volatile memory, and is downloaded to volatile memory as part of an initialization sequence. The process by which configuration information persistently stored in nonvolatile memory (e.g., EEPROM) is transferred to volatile memory (e.g., SRAM) upon initialization of the PLD is known as configuration loading ("conloading"). Using both types of memory to configure a PLD exploits the performance advantages of SRAM when the PLD is in operation, while still allowing the PLD to be powered down with no loss of configuration data by storing the data in nonvolatile memory.

PLDs having both volatile and nonvolatile memory, however, suffer from several drawbacks. First, the conloading process depends on reliably detecting power-up, which can be difficult. If, for example, the power supply powering the PLD does not power up smoothly, conloading may start before there is sufficient power to properly read from the nonvolatile memory, or write to the volatile memory. Also, in some CPLD target systems, particularly target systems having multiple system voltages, it can take a significant period of time for the target system to reach an initial stable system power level. Furthermore, once the power supply is stabilized, such PLDs are not ready for operation until all of the configuration information has been transferred from the nonvolatile memory to the volatile memory (i.e., the conloading process is complete), further delaying startup. This transfer or initialization process can take from approximately 20 µs to approximately 100 µs, and, in some cases can take much longer, for example up to 1 second.

Another disadvantage in using both volatile and nonvolatile memory is the increased burden on limited system resources. Having two sets of memories means that either additional area is consumed on the PLD, if on-chip memory is used, or an additional external device must be placed in the system for off-chip memory. Also, additional control circuitry and overhead must be designed and implemented to manage the conloading process and ensure synchronization between the two sets of memories. All of these factors can contribute to increased design and manufacturing costs.

To address the disadvantages of the conloading process, a special EEPROM cell that combines the performance benefits of tradition SRAM cells with the persistence of a traditional EEPROM cell can be used to configure the PLD directly. This eliminates the conloading step, and the delay, overhead, and other disadvantages associated with that process. One example of such an EEPROM cell, and a description of its operation, is set forth in U.S. Pat. No. 5,272,368 to Turner et al., which is incorporated herein by reference.

An example of a prior art EEPROM cell 100 (consistent with the cell disclosed by Turner et al.) is shown in FIG. 1A. EEPROM cell 100 comprises an access gate 105, a tunnel capacitor 107 (shown as a transistor since it is formed like a transistor), a control gate 121, a floating gate 133, and inverters 140 (comprising transistors 141 and 144) and 150. Tunnel capacitor 107 typically has a very thin oxide layer, in some cases approximately 85 Angstroms. Floating gate 133 is a polysilicon (poly) layer shared between tunnel capacitor 107 and inverter 140. Data is stored in EEPROM cell 100 by injecting and storing a charge on floating gate 133, and can be read or detected through inverters 140 and 150. Control gate 121 controls the process for injecting or removing a charge on floating gate 133. One advantage of this arrangement is that data can be read without additional sense amplifiers, thereby conserving power. Inverters 140 and 150 provide a rail-to-rail output, and eliminate the need for sense amplifiers. Details regarding programming, erasing, and reading EEPROM cell 100 can be found in the above-referenced patent to Turner et al.

FIG. 1B shows a top view of a layout 180 of EEPROM cell 100 (note that inverter 150 is not shown for clarity). In layout 180, tunnel capacitor 107 and control gate 121 are formed in a single polysilicon layer. Floating gate 133, at the input of inverter 140, is also formed in the same polysilicon layer. Since tunnel capacitor 107 requires a very thin oxide, control gate 121 and floating gate 133 (formed in the same poly layer) have the same thin oxide.

Area on an integrated circuit is always at a premium, and minimizing the area of an IC without sacrificing performance or functionality is always a goal in designing ICs. As IC area is reduced, the cost of manufacturing an IC is also reduced. A disadvantage of the prior art single poly EEPROM cell described above is that it does not easily lend itself to an efficient layout, and can therefore be difficult to shrink as process technology improves. One reason for this disadvantage is the coupling capacitance requirement for such EEPROM cells. The coupling ratio relates the coupling capacitance of the control gate to the capacitance of the tunnel capacitor. Generally, a high coupling ratio is necessary to ensure that most of the high voltage difference applied to the EEPROM cell can be applied to the floating gate. High voltage differences are needed at the floating gate in order to program and erase the EEPROM cell.

Furthermore, the prior art single poly EEPROM cell is susceptible to reliability problems due to the thin oxide layer required by the tunnel capacitor. For instance, the prior art cell can have data retention issues, wherein the oxide degrades over time due to the high voltages used. The thin oxide of the prior art EEPROM cell can also lead to read and/or write errors in the memory cell.

Therefore, a need exists for a low-power EEPROM cell having a high coupling ratio that is area efficient, reliable and easily shrinkable.

SUMMARY OF THE INVENTION

In accordance with the present invention, double polysilicon EEPROM technology allows for a low-power, area-efficient, and shrinkable EEPROM cell having a higher coupling ratio as compared to prior art single poly EEPROM cells. A floating gate and a control gate are formed in a stacked poly configuration, providing for efficient use of area and greater capacitive coupling between the two gates. In accordance with the present invention, the double poly EEPROM cell can be used to configure a programmable logic device.

An aspect of the invention is a nonvolatile memory cell including an inverter, an access gate coupled to the inverter for controlling access to the memory cell, and a control gate. The inverter may include a floating gate at an input of the inverter, the floating gate formed in a first polysilicon layer, and a tunnel window formed in a tunnel oxide area, wherein the tunnel oxide area is covered by at least a portion of the floating gate. The control gate may control charge on the floating gate, and may be formed in a second polysilicon layer, wherein the second polysilicon layer is above the first polysilicon layer. Another aspect of the invention may be a memory cell including an SRAM section, an EEPROM section, and a shared transistor having a tunnel window, wherein the shared transistor is shared by the SRAM section and the EEPROM section.

Additional novel aspects and embodiments are described in the detailed description below. The appended claims, and not this summary, define the scope of the invention.

BRIEF DESCRIPTION OF THE DRAWINGS

The present invention is illustrated by way of example, and not by way of limitation, in the following figures, in which like reference numerals refer to similar elements.

DETAILED DESCRIPTION

The present invention is believed to be applicable to a variety of systems, including systems for configuring programmable logic devices. While the present invention is not so limited, an appreciation of the present invention is presented by way of specific examples. The specific details are set forth to provide a more thorough understanding of the present invention. However, it will be apparent to one ordinarily skilled in the art that the present invention can be practiced without these specific details. In other instances, well-known circuits and devices may be omitted or presented in abstract form in order to avoid obscuring the present invention.

Figure 1A:
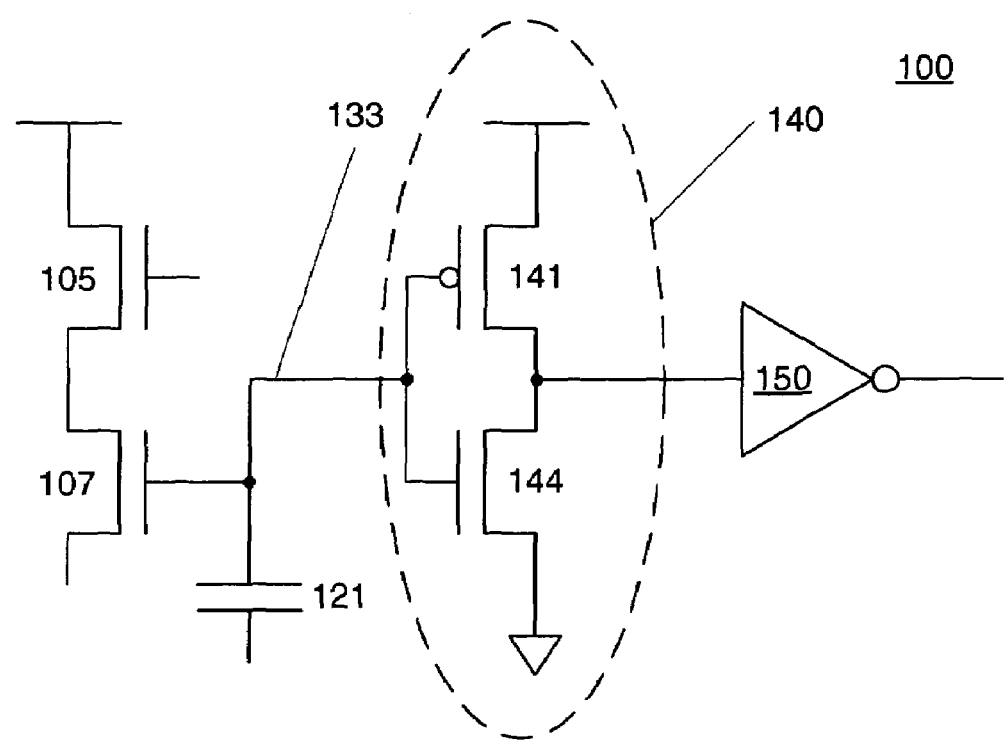
FIG. 1A shows an example of a prior art EEPROM cell.
Figure 2:
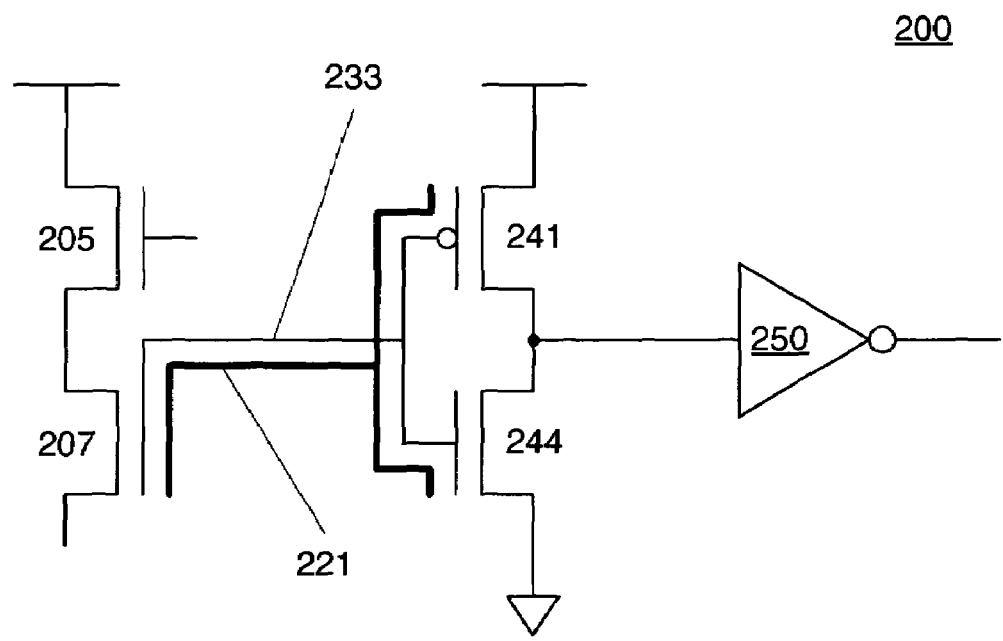
FIG. 2 shows a symbolic representation of an EEPROM cell in accordance with the present invention.

FIG. 2 shows a symbolic circuit diagram of a nonvolatile memory cell 200 in accordance with the present invention. Memory cell 200 comprises an access gate 205, a tunnel capacitor 207, a floating gate 233, an inverter 250, and transistors 241 and 244 (arranged as an inverter), each corresponding to elements 105, 107, 133, 150, 141, and 144 of FIG. 1A, respectively. Note that transistor 241 may be a P-type transistor having a source coupled to a power supply voltage, transistor 244 may be an n-type transistor having a source coupled to a ground voltage, the gates of transistors 241 and 244 may be coupled together to form an input of the inverter, and the drains of transistors 241 and 244 may be coupled together to form an output of the inverter. As with control gate 121 in memory cell 100, a control gate 221 is used to control injecting and removing charge stored on floating gate 233. The charge on floating gate 233 represents the data stored in the memory cell, and can be detected by the inverter formed by transistors 241 and 244. However, memory cell 200 differs from memory cell 100 in one significant way. In memory cell 200, control gate 221 is implemented as a second layer of polysilicon (poly) stacked on top of floating gate 233. This enhancement offers several important benefits.

Implementing control gate 221 as a second poly layer above floating gate 233 facilitates an efficient layout. In prior art single poly EEPROM cells, the control gate capacitor occupies a large area (since capacitance is directly proportional to area, and a high capacitance is necessary to meet coupling ratio requirements), thereby increasing manufacturing costs. In the present invention, however, control gate 221 shares area with floating gate 233, reducing the area required for the memory cell. Furthermore, this double poly arrangement increases the coupling ratio, further improving area efficiency. Since control gate 221 and floating gate 233 directly overlap each other (as described in greater detail below), separated only by an oxide layer, the two gates are highly coupled. The high coupling ratio ensures that the most of the high voltage difference applied to the EEPROM cell during erase and program is applied to floating gate 233.

Figure 1B:
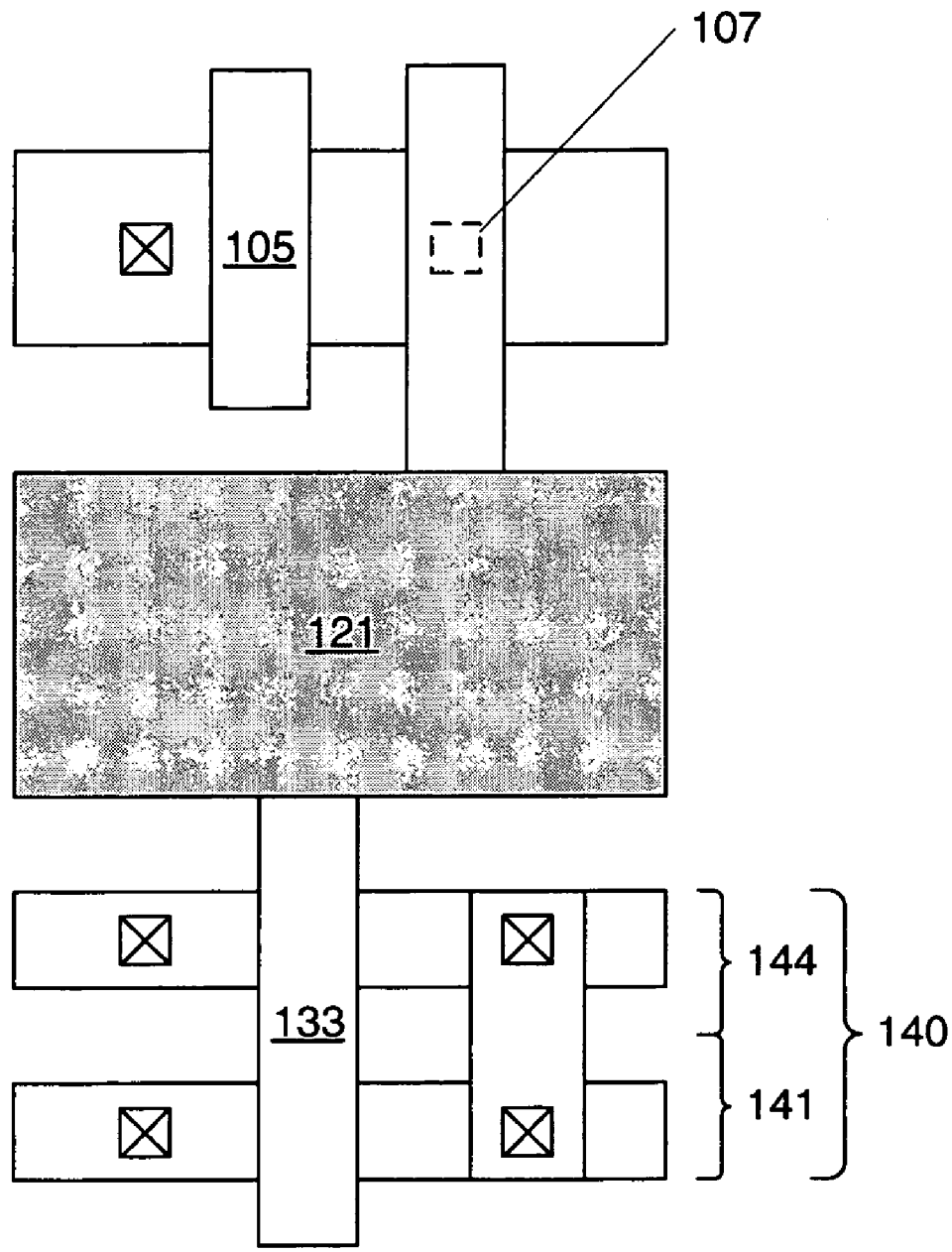
FIG. 1B shows a top view of the prior art EEPROM cell of FIG. 1A.
Figure 3A:
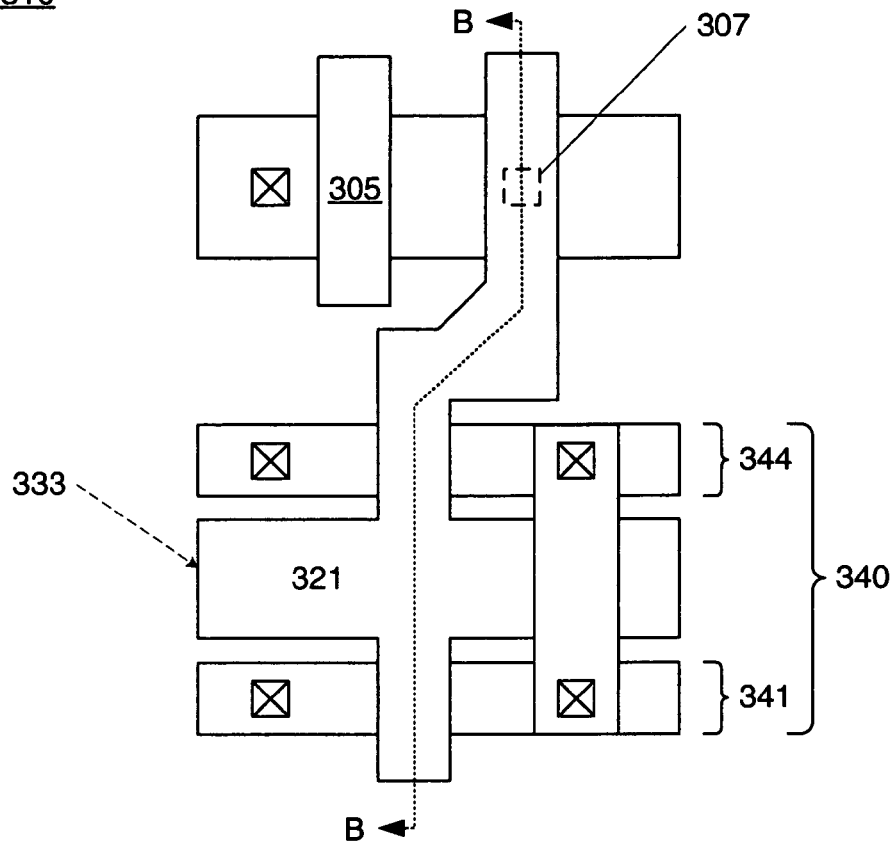
FIGS. 3A and 3B show top and cross-sectional views, respectively, of an embodiment of the present invention.

FIG. 3A shows a top view of a layout of a memory cell 310 in accordance with the present invention. Memory cell 310 consists of an access gate 305, a tunnel capacitor 307, a control gate 321, floating gate 333 (beneath control gate 321), and transistors 344 and 341 (forming inverter 340), each corresponding to elements 205, 207, 221, 233, 244, and 241 of FIG. 2, respectively (note that inverter 250 is not shown for clarity). Floating gate 333 is formed in a first poly layer, and control gate 321 is formed in a second poly layer stacked above floating gate 333. This stacked configuration reduces the overall area of the memory cell compared to prior art single poly implementations. In particular, in the single poly layout 180 shown in FIG. 1B, a large area (shown as a shaded area) is required for control gate 121. In contrast, a double poly configuration as shown in FIG. 3A, in which the control gate shares area with the floating gate, can result in a 30% savings in area over the prior art. As is known to those of ordinary skill in the art, layout configurations for memory cell 200 other than the layout shown in FIG. 3A are possible.

Figure 3B:
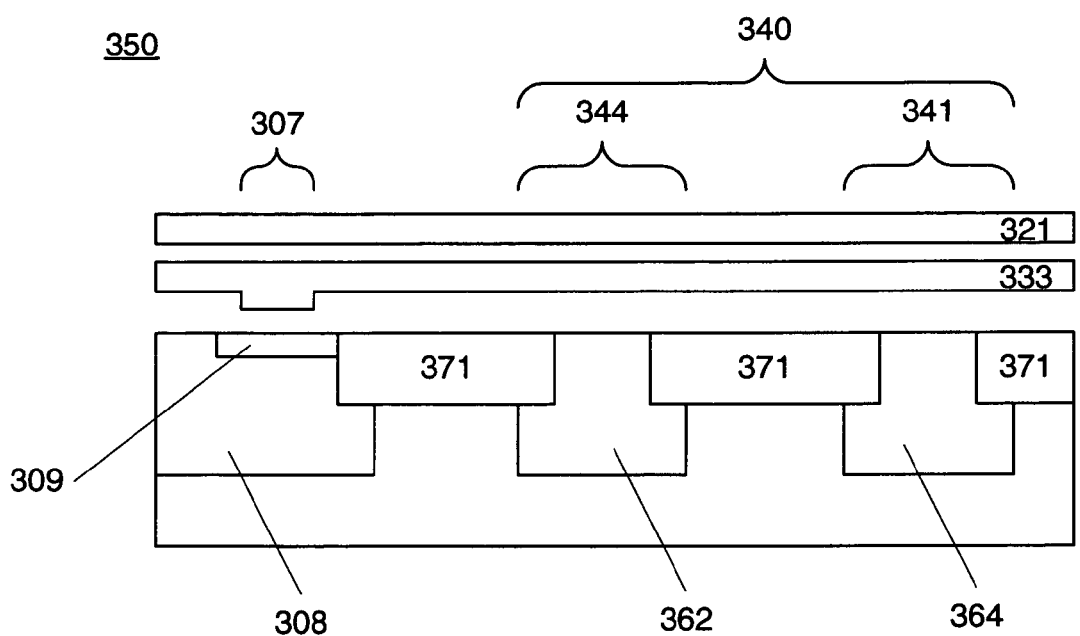

FIG. 3B shows a cross-sectional view 350 of memory cell 310 from FIG. 3A taken at line B-B. This view illustrates the stacked configuration of control gate 321 and floating gate 333 in a side view. Cross-section 350 shows a P-well 362, in which NMOS transistor 344 is formed, an N-well 364, in which PMOS transistor 341 is formed, and STI (shallow trench isolation) regions 371. Tunnel capacitor 307 is formed over a high-voltage N-well 308 and a tunnel implant area 309, and is characterized by a thinner tunnel oxide. In one example, the tunnel oxide layer has a thickness of approximately 85 Angstroms. The gate oxide (for transistors 344 and 341) can have the same thickness of approximately 85 Angstroms, or can optionally have a thicker oxide that can reduce oxide degradation due to the high electric field used to program and erase the memory cell, and thereby improve data retention on the floating gate. In one example, the thicker gate oxide can have a thickness of approximately 225 Angstroms.

As shown in FIG. 3B, floating gate 333 is formed in a first poly layer, and control gate 321 is formed in a second poly layer above floating gate 333 and substantially overlapping floating gate 333. This arrangement results in a very efficient layout, since no extra area is required to implement control gate 321. This arrangement also results in a high coupling capacitance between control gate 321 and floating gate 333, and therefore a high coupling ratio. In general, the high degree of capacitive coupling means that capacitors having smaller area can be used to meet coupling ratio requirements, further improving area efficiency.

Figure 4:
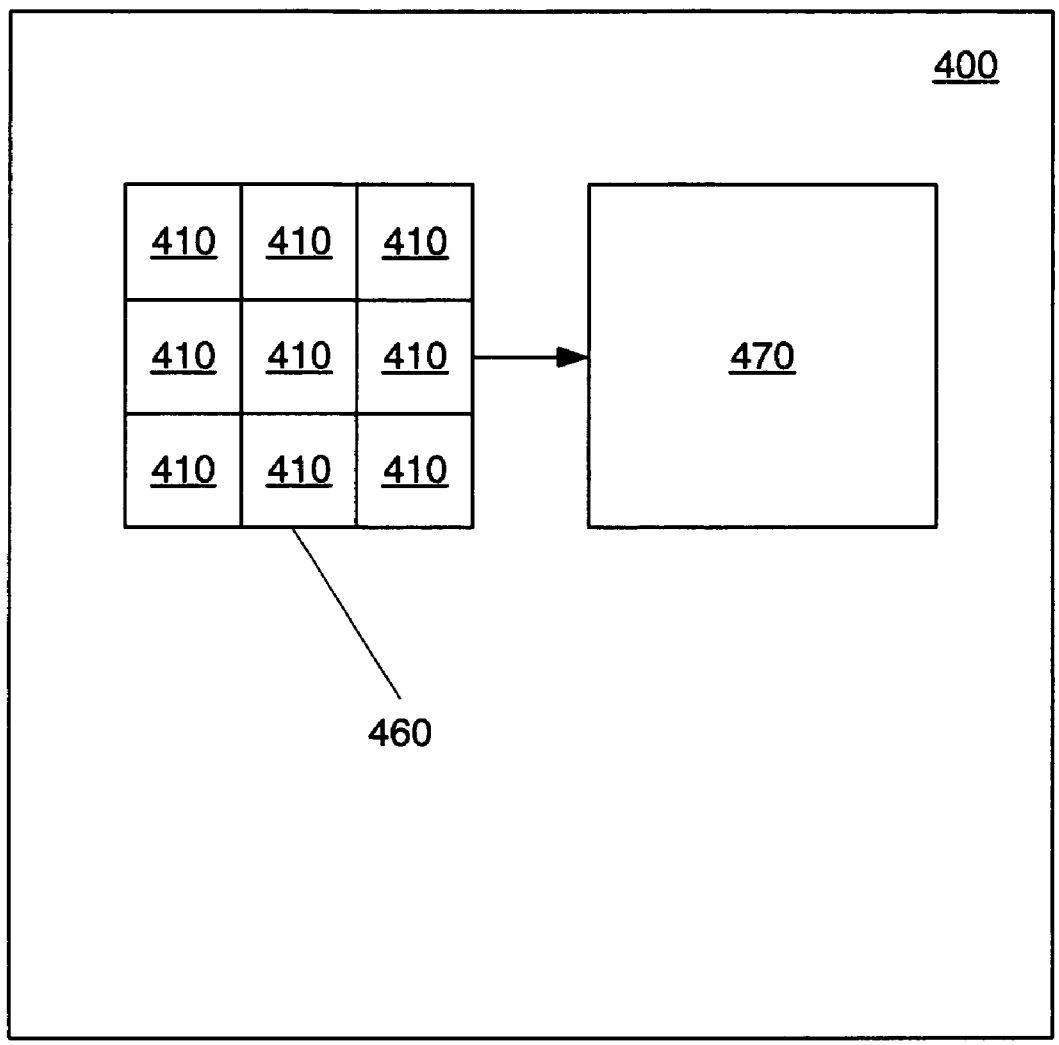
FIG. 4 shows an example of memory cells in accordance with the present invention used to configure programmable logic.

In accordance with the present invention, FIG. 4 shows an example of a block 460 of nonvolatile memory cells 410 being used to configure programmable logic 470. Each memory cell 410 is a circuit similar to circuit 200 of FIG. 2. In some embodiments, memory cells 410 can have a layout similar to the layout of memory cell 310 shown in FIG. 3A. The data stored in memory cells 410 define the functionality of programmable logic 470. Programmable logic 470 can comprise various programmable resources, including CLBs, function blocks, IOBs, interconnect structures, RAM, DLLs, multipliers, processors, transceivers, and other well known programmable resources. In some embodiments, block 460 and programmable logic 470 are both located on an IC 400, which can be a programmable logic device. In other instances, block 460 can be implemented in one or more discrete memory devices, and programmable logic 470 can be implemented in one or more PLDs, each of which are discrete ICs attached to one or more printed circuit boards (PCBs) in a system.

As noted above, one advantage in using nonvolatile memory cells 410 to configure programmable logic 470 eliminates the conloading step, and the associated disadvantages of the conloading process described above. Nonvolatile memory cells in accordance with the present invention consume much less power than EEPROM cells that require a sense amplifier, while still preserving configuration data when power is removed. Furthermore, EEPROM cells in accordance with the present invention take up less area than prior art memory cells, reducing the cost of manufacturing.

Figure 5:
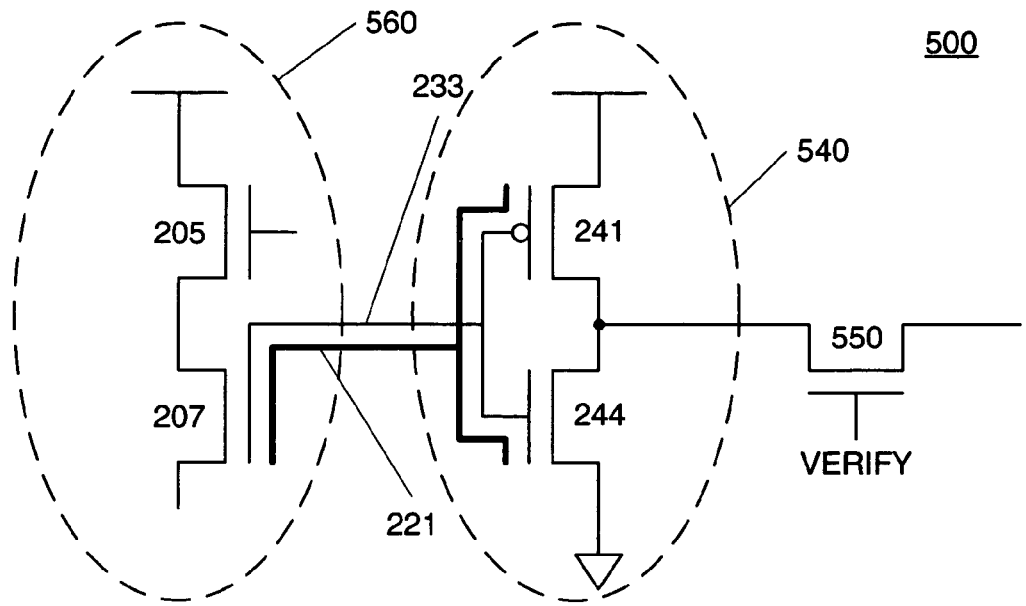
FIG. 5 shows another embodiment of a nonvolatile memory cell in accordance with the present invention.

FIG. 5 shows another embodiment of a nonvolatile memory cell 500 in accordance with the present invention. Nonvolatile memory cell 500 is similar to nonvolatile memory cell 200, except that inverter 250 is replaced by a verify transistor 550 having a gate controlled by a VERIFY signal. Verify transistor 550 gates read access to memory cell 500 and allows a programmed/erased state of the memory cell to be verified. As shown by the dotted ovals, memory cell 500 may be grouped in two sections. The first section 560 may be the EEPROM or flash cell portion of memory cell 500. That is, section 560 includes the structures for programming, erasing, and storing nonvolatile data. The second section 540 may be the SRAM portion of memory cell 500. That is, section 540 includes structure, such as an inverter, that allows for lower power and faster access to the stored data. As noted above, one advantage of the memory cells described herein is that they combine the desirable properties of both EEPROM and SRAM memories.

Figure 6:
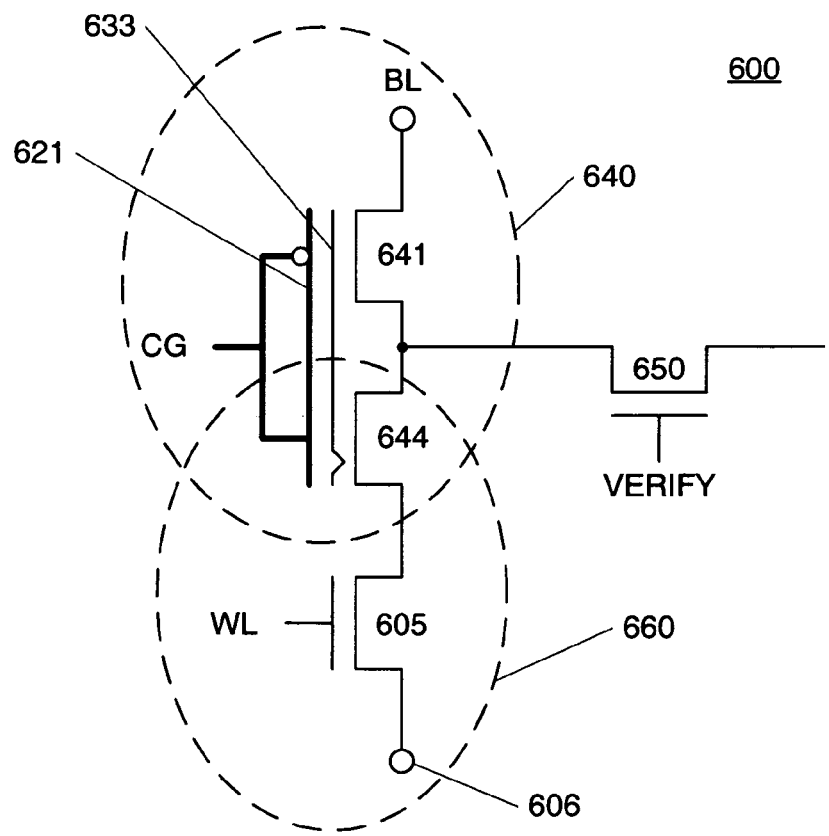
FIG. 6 shows a symbolic representation of an embodiment of a three transistor nonvolatile memory cell in accordance with the present invention.

FIG. 6 shows a symbolic representation of an embodiment of a three transistor (3T) nonvolatile memory cell 600 in accordance with the present invention. Memory cell 600 includes transistors 641 and 644 arranged as an inverter, an access gate 605, and a verify transistor 650. Access gate 605 is coupled between transistor 644 and a node 606, and verify transistor 650 is coupled to the output of the inverter formed by transistors 641 and 644. A source of transistor 641 may be coupled to a bit line BL, and access gate 605 may be controlled by a word line signal WL. Memory cell 600 includes a floating gate 633, similar to the floating gate 233 of memory cell 200, for storing a charge corresponding to the data stored in the cell, and a control gate 621, which is coupled to control gate signal CG. Transistor 644 includes a tunnel window for injecting and removing charge from floating gate 633. The tunnel window is formed over a tunnel implant area and a tunnel oxide layer that is thinner than a normal oxide layer. Similar to memory cell 200, control gate 621 is formed in a first polysilicon layer, and floating gate 633 is formed in a second polysilicon layer below control gate 621. As noted above, this configuration increases coupling capacitance and the coupling ratio, thereby reducing the area required. Also, since control gate 21 and floating gate 633 share area, the area required for memory cell 600 is further reduced.

Memory cell 600 includes two sections 660 and 640, similar to sections 560 and 540 of memory cell 500. That is, section 660 may be the EEPROM portion of memory cell 600, and section 640 may be the SRAM portion of memory cell 600. Note that sections 660 and 640 overlap and share transistor 644. Transistor 644 serves a dual purpose, and eliminates the need for a separate tunnel capacitor by incorporating a tunnel window in its structure. That is, transistor 644 functions both as the pulldown device in the inverter of section 640, and the control and tunnel gate of section 660. This advantageously allows for the four transistors needed for memory cell 500 to be reduced to just 3 transistors in memory cell 600. The reduced number of transistors advantageously allows for further savings in area, with a corresponding reduction in cost.

Figure 7A:
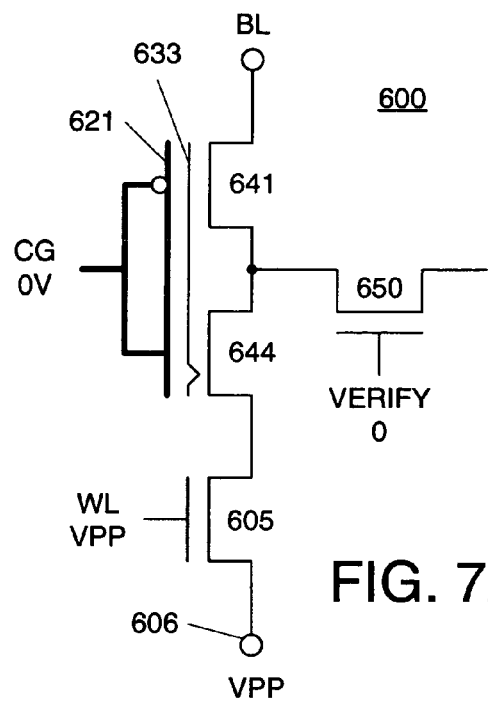
FIGS. 7A-7C show the memory cell of FIG. 6 in various modes of operation.
Figure 7B:
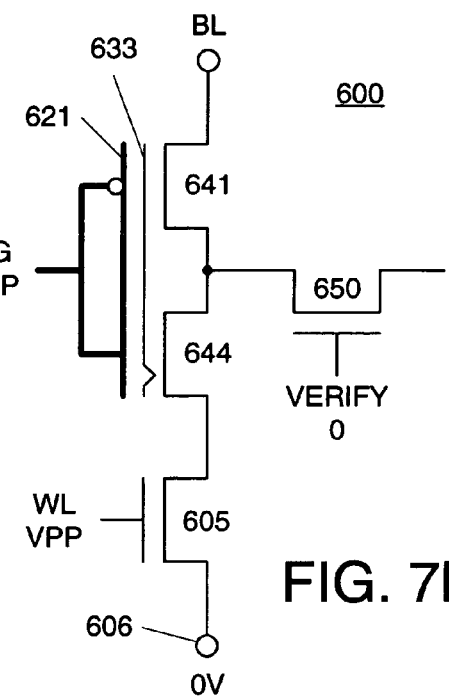
Figure 7C:
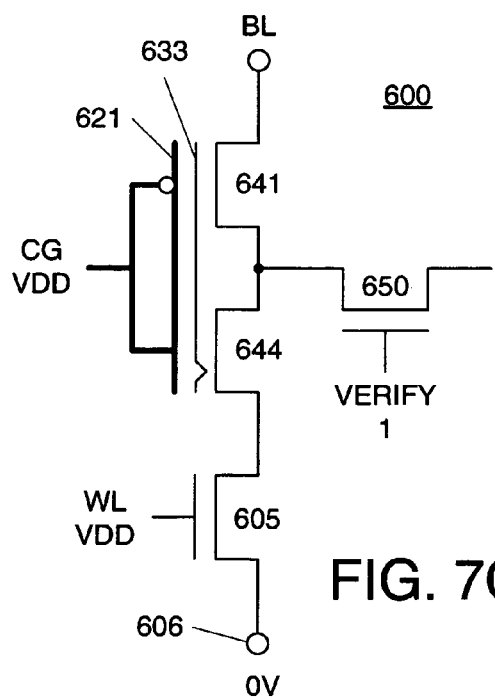
Figure 8:
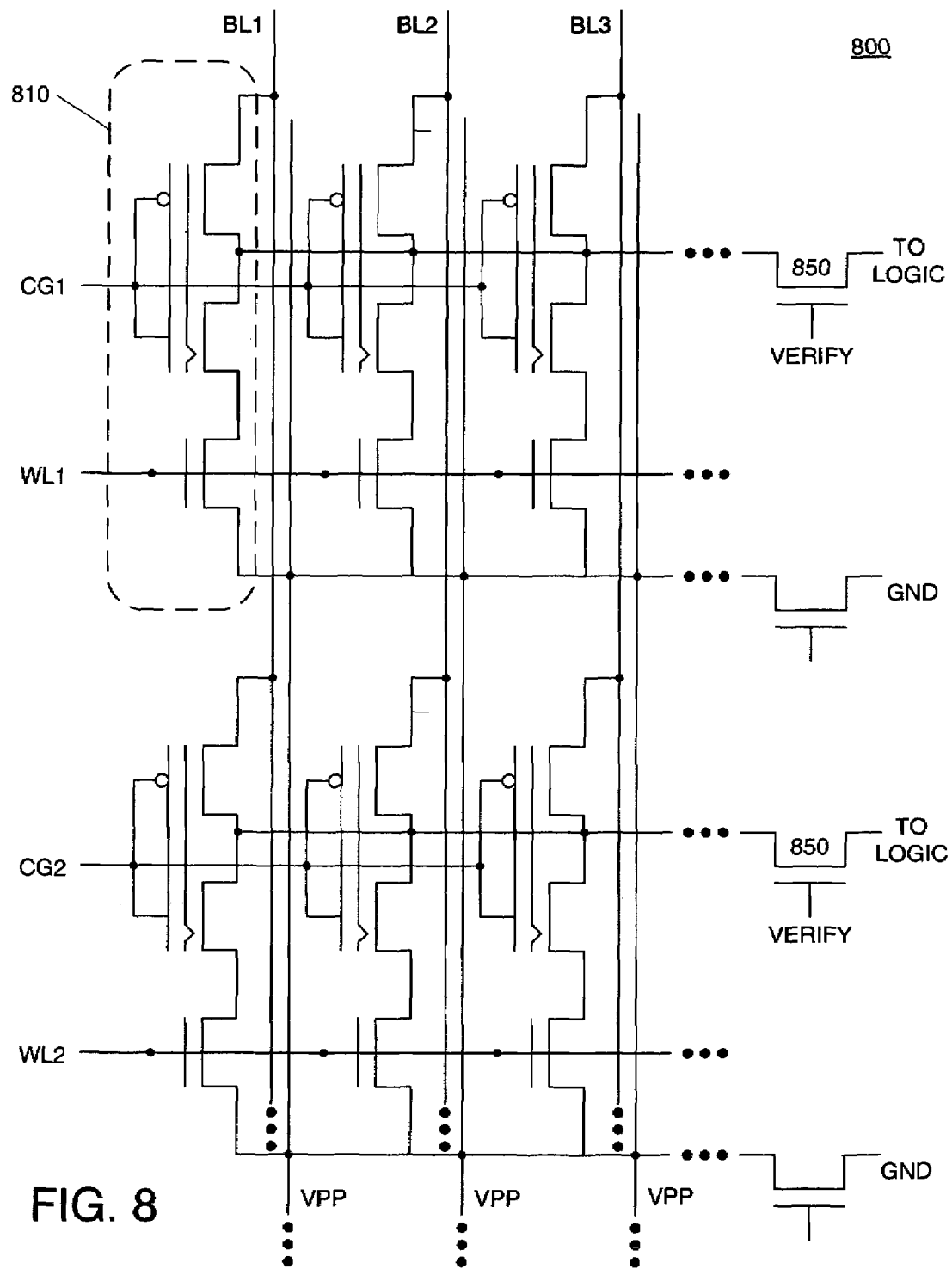
FIG. 8 shows a symbolic representation of multiple nonvolatile memory cells of arranged in an array.

FIGS. 7A-7C show memory cell 600 in various modes of operation. In particular, FIGS. 7A and 7B show memory cell 600 configured for a program and an erase operation, respectively. The memory cell may be selected for an operation by applying a supply voltage VDD, which may be 1.8V in some embodiments, at bit line BL, and by applying a high program voltage VPP, which may be 13V in some embodiments, at word line WL. For example, multiple memory cells 600 may be arranged in an array of rows and columns, for example as shown in FIG. 8 (discussed below), and the BL and WL signals may be used to select a particular cell. During a program or erase operation, the VERIFY signal is set to a logic 0, typically a ground voltage of 0V, to disable verify transistor 650.

FIG. 7A shows memory cell 600 configured for a program operation. As shown, a ground voltage of 0V is applied to control gate 621, and the high program voltage VPP is applied at node 606. This causes electrons to tunnel through the tunnel window away from floating gate 633. With fewer electrons, floating gate 633 is in a hole rich state corresponding to a programmed state of memory cell 600.

FIG. 7B shows memory cell 600 configured for an erase operation. In an erase operation a ground voltage of 0V is applied at node 606, and the high program voltage VPP is applied to control gate 621. This causes electrons to be injected through the tunnel window onto floating gate 633, thereby placing floating gate 633 in an electron rich state. This state corresponds to an erased state of memory cell 600.

FIG. 7C shows memory cell 600 configured for a read or verify operation. In this configuration, memory cell 600 may be used to provide the stored data, such as configuration data to a programmable resource. For example, data stored in memory cell 600 may be used in place of cells 410 in IC 400 to configure programmable logic 470. This configuration may also be used to verify that data has been correctly programmed/erased from the memory cell. The supply voltage VDD is applied at bit line BL and word line WL to select a particular memory cell for reading, and ground voltage is applied at node 606. The VERIFY signal is a logic 1, typically the supply voltage VDD, to enable verify transistor 650. Configured in this way, the state of the nonvolatile memory, corresponding to the state of floating gate 633, may be determined. The inverter formed by transistors 641 and 644 produces an output based on the charge stored on floating gate 633. If memory cell 600 is in a programmed state, the hole rich state of floating gate 633 causes a logic 0 to be read at the output of the memory cell. If memory cell is in an erased state, the electron rich state of floating gate 633 causes a logic 1 to be read at the output of the memory cell.

FIG. 8 shows a symbolic representation of multiple nonvolatile memory cells of arranged in an array. Each memory cell 810 operates in the manner described above with respect to memory cell 600 of FIG. 6. That is, each memory cell in the array may be a 3T nonvolatile memory cell. The outputs of the memory cells in each row are connected together and coupled to a common verify transistor 850. In some embodiments, data output from verify transistors 850 may be coupled to programmable resources such as configurable logic. In some embodiments, verify transistors 850 may be controlled by a common VERIFY signal for reading a column of data at a time. The control gates and access gates in the memory cells of each row are also coupled together.

As shown, the control gates for each row may be coupled to signals CG1, CG2, . . . respectively, and the access gates for each row are coupled to word line signals WL1, WL2, . . . , respectively. The bit lines of each memory cell 810 are coupled to a common bit line BL1, BL2, BL3, . . . , respectively, for each column of cells. Finally, node 606 of each memory cell may be selectively coupled to the high program voltage VPP or to ground voltage, for example through pass gates, depending on the mode of operation. As previously noted, a particular memory cell 810 may be selected for programming or erasing by asserting the appropriate bit and word lines.

Figure 9:
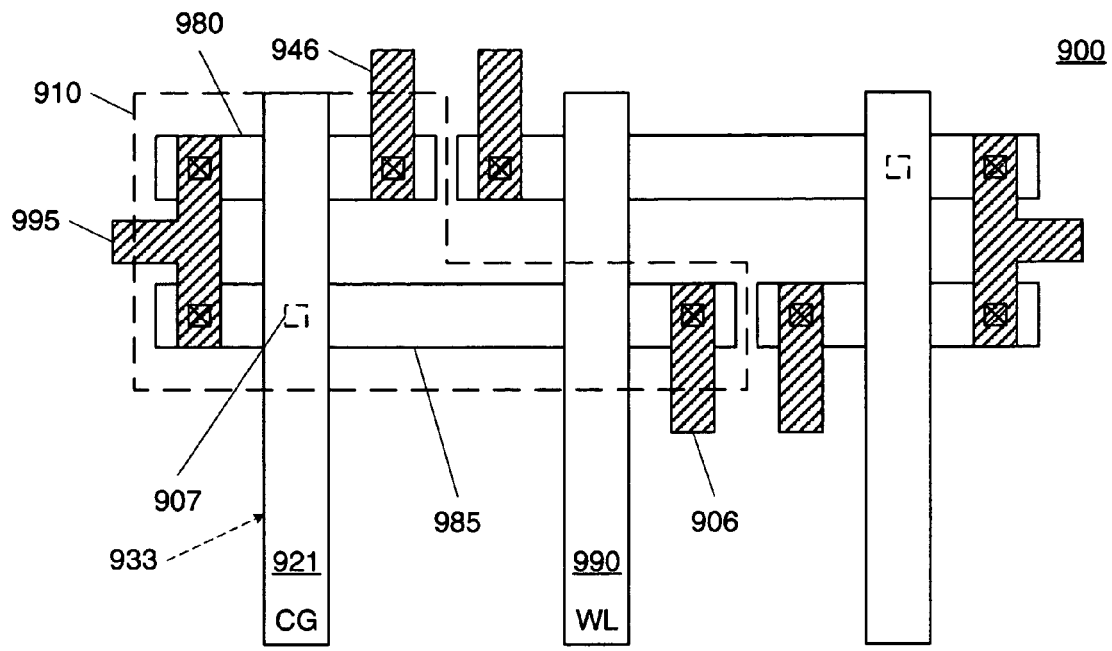
FIG. 9 shows a top view of a layout of three transistor nonvolatile memory cells in accordance with the present invention.

FIG. 9 shows a top view of a layout 900 of 3T nonvolatile memory cells in accordance with the present invention. Layout 900 shows two identical memory cells that correspond to memory cell 600. One memory cell 910 is marked by a dashed box in the figure. Memory cell 910 includes P-diffusion 980, in which a p-type transistor corresponding to transistor 641 is formed, and N-diffusion 985, in which n-type transistors corresponding to transistors 644 and 605 are formed. A control gate 921 is formed in a polysilicon (poly) layer above the floating gate 933 (as indicated by the dashed arrow), which is formed in another poly layer. A word line 990 is also formed in a polysilicon layer. Memory cell 910 also includes tunnel window 907, metal layer 995 forming the output of the memory cell, metal layer 946 corresponding to the bit line BL connection in FIG. 6, and metal layer 906 corresponding to node 606 in memory cell 600.

Figure 10A:
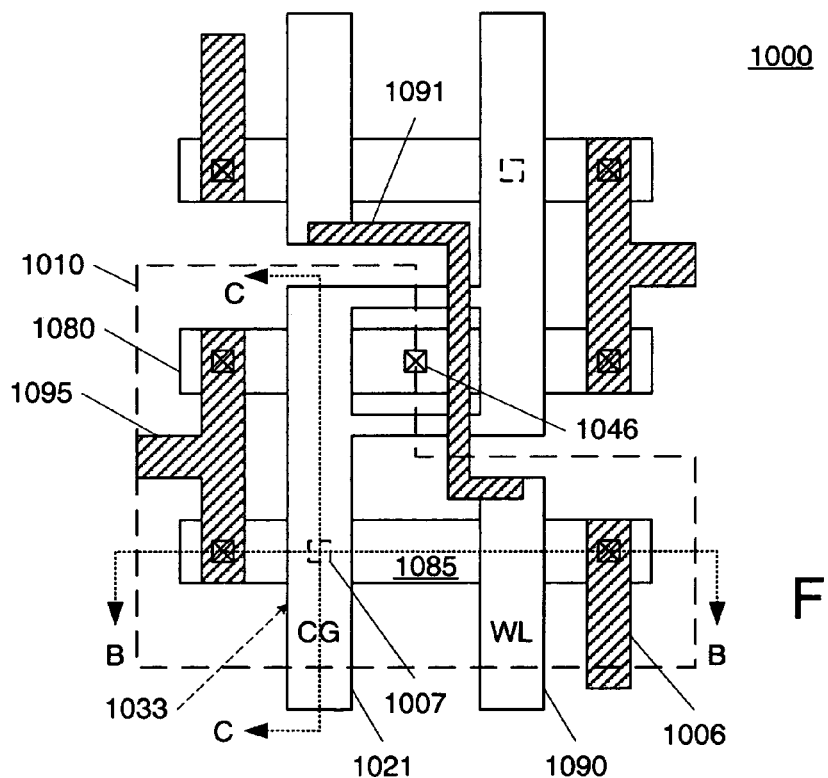
FIGS. 10A-10C show top and cross-sectional views of an alternative layout of three transistor nonvolatile memory cells in accordance with the present invention.
Figure 10B:
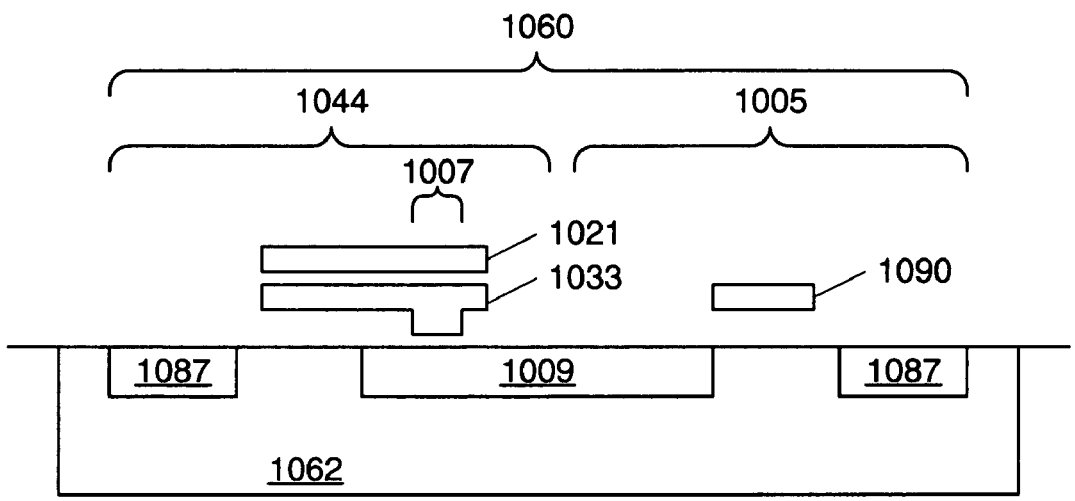
Figure 10C:
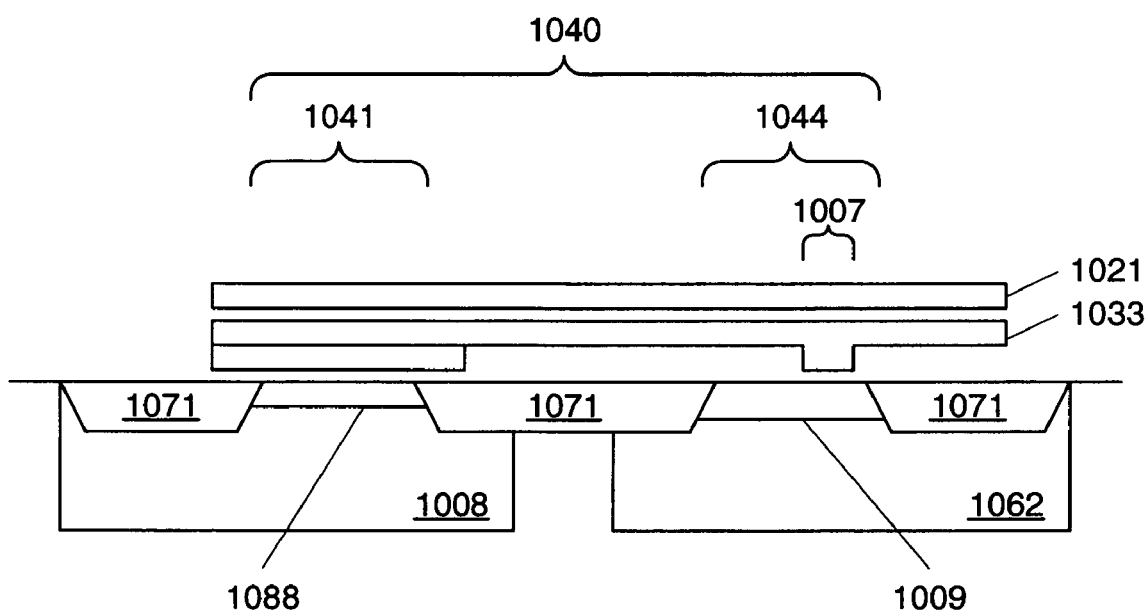

FIGS. 10A-10C show top and cross-sectional views of an alternative layout 1000 of 3T nonvolatile memory cells in accordance with the present invention. FIG. 10A shows the top view of layout 1000, including two identical memory cells implementing the same circuit as layout 900 and corresponding to memory cell 600. One memory cell 1010 is marked by a dashed box in the figure. Memory cell 1010 includes P-diffusion 1080, in which a p-type transistor corresponding to transistor 641 is formed, and N-diffusion 1085, in which n-type transistors corresponding to transistors 644 and 605 are formed. A control gate 1021 is formed in a poly layer above the floating gate 1033 (as indicated by the dashed arrow), which is formed in another poly layer. A word line 1090 is also formed in a polysilicon layer. Note that the word line 1090 may be connected to word lines of other memory cells by metal lines, such as metal line 1091. Memory cell 1010 also includes tunnel window 1007, metal layer 1095 forming the output of the memory cell, metal layer 1006 corresponding to node 606 in memory cell 600, and a contact 1046 for connecting to a metal layer corresponding to the bit line BL connection in FIG. 6.

FIG. 10B shows a cross-sectional view of layout 1000 of FIG. 10A taken along line B-B. FIG. 10B shows control gate 1021 formed in a polysilicon layer above floating gate 1033. Tunnel window 1007 is formed over an n+ tunnel implant area 1009. Note that tunnel window 1007 has a very thin tunnel oxide layer. Word line 1090 is formed in a polysilicon layer over an oxide layer that may have a normal oxide thickness. Transistors 1044 and 1005 correspond to transistors 644 and 605, respectively, of memory cell 600, and together they form section 1060 corresponding to EEPROM section 660. FIG. 10B also shows N+ regions 1087 and P-well 1062.

FIG. 10C shows a cross-sectional view of layout 1000 of FIG. 10A taken along line C-C. The cross-sectional view shows transistors 1041 and 1044, corresponding to transistors 641 and 644, respectively, of memory cell 600. Transistors 1041 and 1044 form an inverter of SRAM section 1040, corresponding to section 640. Transistor 1041 is formed in N-well 1008 and transistor 1044 is formed in P-well 1062. Control gate 1021 and floating gate 1033 are again shown in their stacked configuration, and tunnel window 1007 is shown over the thin tunnel oxide and tunnel implant area 1009. STI areas 1071 are formed between the transistors. Transistor 1041 may be formed over a buried p-channel 1088. In some embodiments, transistor 1041 may be formed with a thin tunnel oxide (as shown). In other embodiments, transistor 1041 may be formed with a thicker oxide layer.

Note that both layouts 900 and 1000 are very compact and occupy only a small area. This advantageously reduces the area occupied by memory cells in accordance with the present invention. A smaller area and more compact layout allows for lower manufacturing costs. Also, since configuration data stored in the memory cells may be provided directly without any additional sensing mechanism, power efficiencies may be achieved, and the problematic conloading step may be eliminated.

It will be apparent to one ordinarily skilled in the art after reading this specification that the present invention can be practiced within these and other architectural variations, and one having ordinary skill in the relevant arts of the invention will now perceive various modifications and additions that can be made as a result of the disclosure herein. For example, the above text describes the circuits and methods of the invention in the context of ICs such as programmable logic devices. However, the nonvolatile memory cell of the invention can also be implemented in other systems, for example, in discrete standalone memory devices. For another example, other similar fabrication processes not inconsistent with the present invention can be used. As another example, although particular layout embodiments have been shown, other layouts embodying the present invention are possible.

Moreover, some components are shown directly connected to one another while others are shown connected via intermediate components. In each instance, the method of interconnection establishes some desired electrical communication between two or more circuit nodes. Such communication can often be accomplished using a number of circuit configurations, as will be understood by those of ordinary skill in the art.

Accordingly, all such modifications and additions are deemed to be within the scope of the invention, which is to be limited only by the appended claims and their equivalents.

What is claimed is:

1. A nonvolatile memory cell comprising:
an inverter, the inverter comprising:
    a first transistor coupled to an input of the inverter;
    a second transistor coupled in series to the first transistor;
    a floating gate at the input of the inverter, the floating gate formed in a first polysilicon layer and coupled to gates of the first and second transistors, and
    a tunnel window formed in a tunnel oxide area over a channel region of the second transistor, wherein the tunnel oxide area is covered by at least a portion of the floating gate;
an access gate coupled to the inverter for controlling access to the nonvolatile memory cell;
wherein the access gate includes a third transistor coupled in series to the second transistor; and
a control gate for controlling charge on the floating gate, wherein the control gate is formed in a second polysilicon layer, and wherein the second polysilicon layer is above the first polysilicon layer.

2. The nonvolatile memory cell of claim 1, wherein the control gate overlaps at least a portion of the floating gate.

3. The nonvolatile memory cell of claim 1, further comprising a verify transistor coupled to an output of the inverter.

4. The nonvolatile memory cell of claim 1, wherein the nonvolatile memory cell is a configuration memory cell for configuring a programmable resource.

5. The nonvolatile memory cell of claim 1, wherein at least a portion of the first polysilicon layer is formed over a thick gate oxide.

6. An integrated circuit comprising:
a programmable resource; and
a nonvolatile memory cell coupled to the programmable resource for configuring the programmable resource;
wherein the nonvolatile memory cell comprises:
an inverter, the inverter comprising:
    a first transistor coupled to an input of the inverter;
    a second transistor coupled in series to the first transistor;
    a floating gate at the input of the inverter, the floating gate formed in a first polysilicon layer and coupled to gates of the first and second transistors, and
    a tunnel window formed in a tunnel oxide area over a channel region of the second transistor, wherein the tunnel oxide area is covered by at least a portion of the floating gate;
an access gate coupled to the inverter for controlling access to the nonvolatile memory cell;
wherein the access gate includes a third transistor coupled in series to the second transistor; and
a control gate for controlling charge on the floating gate, wherein the control gate is formed in a second polysilicon layer, and wherein the second polysilicon layer is above the first polysilicon layer.

7. The integrated circuit of claim 6, wherein the programmable resource is selected from the group consisting of CLBs, function blocks, IOBs, interconnect structures, RAM, DLLs, multipliers, processors, and transceivers.

8. The integrated circuit of claim 6, wherein the nonvolatile memory cell is one of a plurality of nonvolatile memory cells arranged in an array of rows and columns.

9. The integrated circuit of claim 8, wherein the plurality of nonvolatile memory cells arranged in an array of rows and columns comprises a plurality of word lines and a plurality of bit lines for selecting a selected nonvolatile memory cell.

10. The integrated circuit of claim 6, wherein the integrated circuit is a programmable logic device.

11. The integrated circuit of claim 10, wherein the programmable logic device is a complex programmable logic device.

12. A memory cell comprising:
an SRAM section;
an EEPROM section; and
a shared transistor having a tunnel window,
wherein the shared transistor is shared by the SRAM section and the EEPROM section;
wherein the EEPROM section comprises an access gate; and
wherein the SRAM section comprises an inverter, the inverter comprising a first transistor and the shared transistor,
the first transistor coupled between a bit line and an output of the inverter, and the shared transistor coupled between the output of the inverter and the access gate.

13. The memory cell of claim 12, wherein the shared transistor is a pulldown device of the inverter.

14. The memory cell of claim 13, wherein the inverter comprises a floating gate in a first polysilicon layer and a control gate in a second polysilicon layer, the first and second polysilicon layers having a stacked configuration.

15. The memory cell of claim 14, wherein the memory cell is a configuration memory cell for configuring a programmable resource.

16. The memory cell of claim 15, further comprising a verify transistor coupled to the output of the inverter.

* * * * *